Oct. 24, 1967 J. L. ZAR 3,349,351

CRYOGENIC RADIO FREQUENCY RESONANT CIRCUITS COMPRISING SUPERCONDUCTIVE INDUCTANCE AND CAPACITANCE

Filed Aug. 1, 1963

2 Sheets-Sheet 1

JACOB L. ZAR
INVENTOR.

BY Alden D. Redfield
Melvin E. Frederick
ATTORNEYS

Oct. 24, 1967 J. L. ZAR 3,349,351

CRYOGENIC RADIO FREQUENCY RESONANT CIRCUITS COMPRISING SUPERCONDUCTIVE INDUCTANCE AND CAPACITANCE

Filed Aug. 1, 1963 2 Sheets-Sheet 2

JACOB L. ZAR
*INVENTOR.*

BY Alden D. Redfield
Melvin E. Frederick
ATTORNEYS

United States Patent Office
3,349,351
Patented Oct. 24, 1967

3,349,351

CRYOGENIC RADIO FREQUENCY RESONANT CIRCUITS COMPRISING SUPERCONDUCTIVE INDUCTANCE AND CAPACITANCE

Jacob L. Zar, Ridgefield, Conn., assignor to Avco Corporation, Cincinnati, Ohio, a corporation of Delaware Filed Aug. 1, 1963, Ser. No. 299,251
5 Claims. (Cl. 334—70)

ABSTRACT OF THE DISCLOSURE

A tuning circuit having high selectivity provided by an inductance wound around a movable core of superconductive material and coupled to a variable capacitance to form a resonant circuit.

The present invention relates to radio frequency resonant circuits and more particularly to cryogenic radio frequency resonant circuits operating in the megacycle range.

In high frequency communication systems, high selectivity is essential to prevent intermodulation and interference from adjacent signal channels. While high selectivity may be achieved by the use of fixed frequency crystal filters, this approach becomes highly complicated and costly when it is necessary to provide a large number of such filters in a receiver with a wide frequency coverage.

High selectivity is simply and inexpensively provided by the present invention which makes available highly selective resonant circuits through the application of superconductivity. Resonant circuits in accordance with the present invention may have a Q of the order of 100,000, provide large tuning ratios, reduced variation of bandwidth with changes in resonant frequency, and a variable control of bandwith in the megacycle range.

In accordance with the present invention, an inductance is wound around a core of superconductive material and coupled to a variable capacitance to form a resonant circuit. The presence of the superconductive core, being a substantially perfect diamagnet when in the superconductive state, expels magnetic flux from it, and consequently from the center of the inductance. In one embodiment, the core is ganged to the variable capacitor whereby, as the capacitor is varied, the position of the core in the inductance is simultaneously varied. Thus, the dynamic range obtainable is the product of the dynamic ranges obtained with variable capacitance or the variable inductance tuning alone, and is thereby maximized. In another embodiment, the inductance and a fixed superconducting core is surrounded by a control coil that produces a field gradient as, for instance, by having a variable pitch. The pitch of the control coil, for given values of current flowing through it, is sufficient to drive the core normal beginning at one end and progressing toward the opposite end until the entire core is normal. Current supplied to the control coil is varied by means of a potentiometer or the like which is ganged to the variable capacitor. Thus, as the capacitor is varied, the inductance varies as a function of the voltage or current applied to the control coil.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

Figure 1:
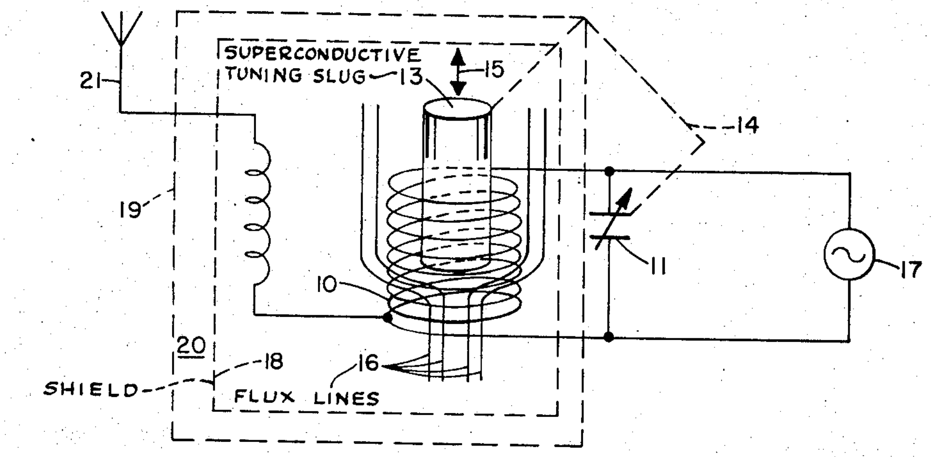
FIGURE 1 is a diagrammatic representation of a tuned circuit in accordance with the present invention.

Directing attention now to FIGURE 1, there is shown an inductance 10 connected across a variable capacitor 11. Movably disposed within the inductance is a superconductive tuning slug 13 which is coupled to the capacitor 11 as indicated by the broken line 14, whereby as the capacitor 11 is varied, the position of the superconducting core or tuning slug 13 in the inductance 10 is varied. Movement of the superconductive tuning slug 13 is indicated by the arrow 15. Whereas the inductance 10 may be formed with superconducting wire or a normal conductor, the superconducting tuning slug 13 is composed of an ideal superconductor such as lead, lead-tin alloy, or tin. While the superconducting tuning slug may be a solid bar, it may more advantageously be in the form of a hollow rod either open or closed at both ends. The term "ideal superconductor" means one which exhibits a complete Meisner effect, i.e., it excludes magnetic flux from its interior as long as it is in the superconducting state. Both the inductance 10 and the variable capacitor 11 are immersed in a cryogenic bath and maintained at temperatures where superconductivty is established. Portions of typical flux lines 16 are shown resulting from a current flowing in the inductance coil, supplied, for example, from an alternating current source 17 or by virtue of its resonance with the capacitor 11. Because of the exclusion of the flux lines from the interior of the inductance by the superconducting tuning slug, the inductance of the coil is decreased as the superconducting tuning slug is inserted into the coil. Thus, the number of magnetic lines of flux linkage in the inductance is substantially reduced by the presence of the superconducting tuning slug or core. The reduction in inductance is proportional to the distance that the tuning slug 13 is inserted in the coil 10.

The inductance L in henries of the coil is given by the approximate equation $$L=n^2\mu[(l_1-l_2)A_1+l_2A_2]$$

Where $\mu$ is the permeability of the medium surrounding the coil, $n$ is the turns per meter of the coil, $A_1$ is the cross-sectional area in square meters of the region of the coil where there is no tuning slug, $A_2$ is the area in square meters of the space between the tuning slug and the coil in the region where the tuning slug is inserted, $l_1$ is the length of the coil in meters, and $l_2$ is the length of the coil in meters that is filled by the tuning slug. From the above equation, it will be seen that the inductance of the coil 10 varies linearly with the depth of the penetration of the tuning slug 13 into the coil and that the change in inductance is proportional to the relative area of the coil occupied by the tuning slug.

The usefulness of the above-described embodiment is destroyed if the tuning slug is driven to the normal state. Thus, the current flowing in the inductance must be limited to values less than that required to establish a magnetic field sufficient to drive the superconducting tuning slug normal. For example, the critical temperature for lead is 7.2° absolute. Thus, if lead is used at 4.2°, the boiling point of helium at one atmosphere pressure, the peak magnetic field created by current flow in the inductance, should not exceed 550 oersteds.

In a radio receiver, it is desirable to perform frequency selection prior to the first active element. Accordingly, a superconducting resonant circuit in accordance with the present invention may be inserted between the antenna input circuit 21 and the grid of the first amplifier stage which would replace current source 17. Amplifier gain can easily be established to compensate for the losses associated with the necessarily light coupling between the resonant circuit and its load. Further, the antenna radiation resistance reflected to the input of the amplifier should be as large as possible compared to the equivalent input noise resistance of the amplifier. These considerations, in addition to the size of the inductance, determine the operating impedance level.

In order to further increase efficiency, losses due to radiation may be reduced by surrounding the inductance with a superconducting shield 18. The provision of the shield materialy increases the Q and permits location of the coil close to metalic objects such as, for example, the wall of a dewar 19 containing liquid helium 20. If the superconducting shield is omitted, maximum Q will not be obtained and the Q will be dependent on the proximity of the coil to nearby metallic objects.

Since tuned circuits in accordance with the present invention are disposed in a cryogenic environment, the capacitor which may be of conventional construction is preferably also composed of superconducting material since this provides the maximum Q for the circuit. The range of tuning of course depends on the degree to which the inductance and capacitor can be varied.

Figure 2:
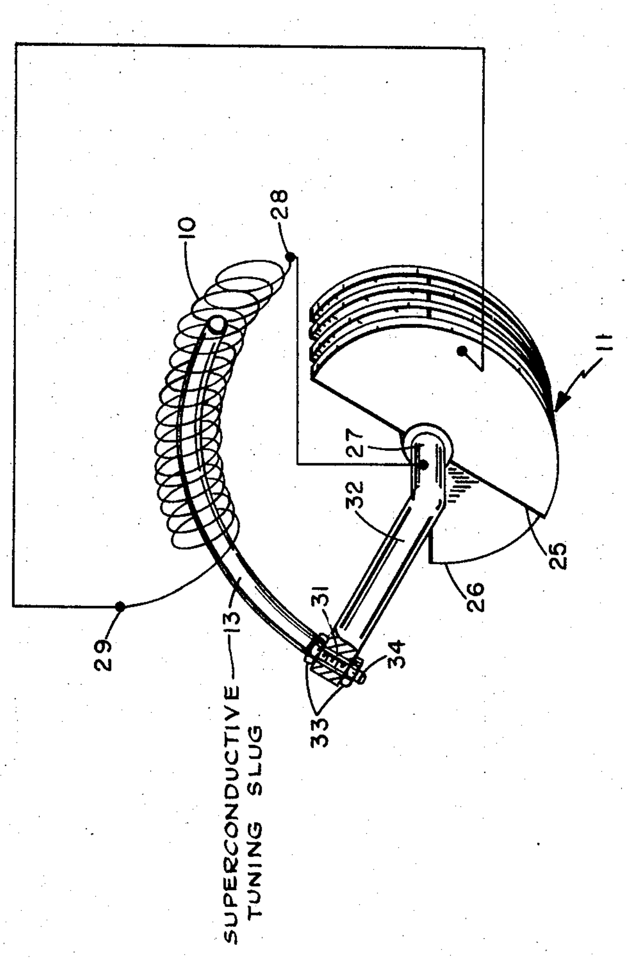
FIGURE 2 is a perspective view illustrating how the inductor and capacitor of FIGURE 1 may be mechanically varied simultaneously.

FIGURE 2 shows a suitable arrangement for mechanically coupling the superconducting tuning slug 13 to the capacitor 11. The movable plates 25 and the fixed plates 26 of the capacitor 11 are preferably comprised of superconducting material. In conventional manner, the movable plates 25 are carried by a rotatable shaft 27 and the remaining plates 26 are fixed. The movable plates 25 are electrically connected to one terminal 29 of the inductance 10 and the fixed plates 26 are connected to the remaining terminal 28 of the inductance 10. The rotatable shaft 27 of the capacitor is L-shaped and is provided with a passage 31 at one end to receive one end of the superconducting tuning slug 13. The tuning slug 13 as well as the inductance 10 is provided with a radius equal to that of arm 32, whereby as the capacitor shaft 27 is rotated, the position of the tuning slug 13 in the inductance 10 is simultaneously varied. Separate radial adjustment of the position of the tuning slug is indicated by nuts 33 on the threaded end 34 of the tuning slug 13. Directing attention now to FIGURE 3, there is illustrated an arrangement wherein inductance is varied as a function of an applied voltage or current. As shown in this figure, the inductance 10 is coupled to a variable capacitor 11 which is mechanically coupled to a potentiometer 41. The potentiometer 41, control coil 42, and battery 43 form a separate series circuit. It is important to note that whereas the inductance 10 is provided with a constant pitch, the control coil 42 is provided with a variable pitch. As noted in connection with FIGURE 1, the inductance and capacitor, depending on the Q desired, may be made of normal material or superconducting material as may the control coil. While the superconducting core 44 may be either a solid bar or hollow, it should be made from an ideal superconductor such as lead, tin, or mercury and should fill as large a fraction of the volume enclosed by the inductance as possible. Furthermore, the core should be in a finely divided or laminated state so that in its normal condition it exhibits only a minimal amount of electrical dissipation at the signal frequency.

Figure 3:
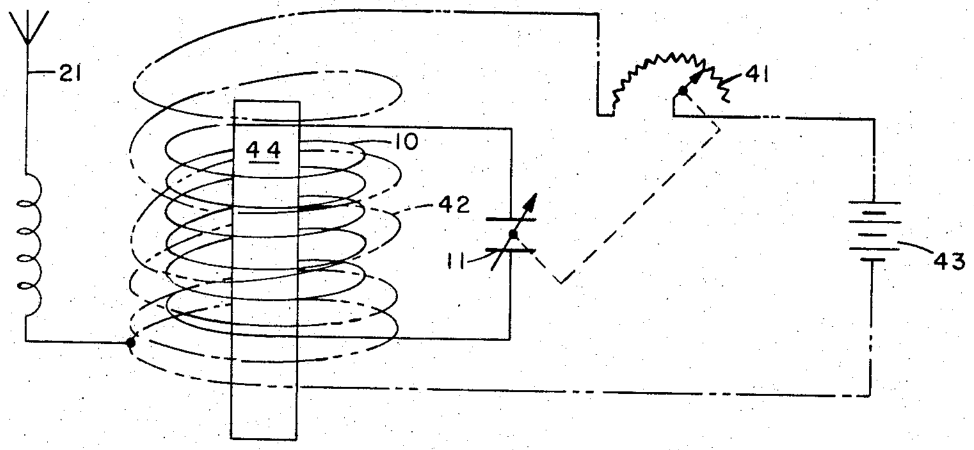
FIGURE 3 is a diagrammatic representation of a tuned circuit wherein mechanical variation of the capacitor simultaneously results in variation of the inductor as a function of an applied voltage or current.

Due to the fact that the pitch of the control coil is greatest at its upper end as shown in FIGURE 3, a greater amount of current in the control coil is required to drive the superconductive core normal at this point than is required to drive the core normal at its lower end. The design here is such that a given current in the control coil drives the superconductive core normal at its lower end and an increased amount of current such as, for example, one half again as much is required to drive the superconductive core normal at its upper end in which case the entire length of the superconductive core is in the normal state. As the value of current flowing through the control coil is increased from the first mentioned value to the second mentioned value, an increasingly larger portion of the superconductive core in its axial direction will be driven normal. The same is true, of course, for the vector addition of magnetic fields produced by current flow in both the control coil and the inductance. The variable pitch of the control coil should provide a magnetic field that varies linearly along its length.

In the event that the inductance is made of superconducting material, it must have a suitably different critical field than that of the superconducting core at the operating temperature chosen. For example, if the inductance coil is made of lead and the superconducting core is made of tin or of mercury, suitably divided or laminated, and if the operating temperature chosen is 2.5° K., the inductance will remain a superconductor up to an applied magnetic field of about 700 oersteds. At the aforementioned temperature, tin becomes a normal conductor at 150 oersteds and mercury becomes a normal conductor at 260 oersteds. Accordingly, for magnetic fields developed by the control coil not exceeding 700 oersteds, the inductance will remain a superconductor and the core will be normal whenever the magnetic field exceeds 150 or 260 oersteds, depending on whether the core is made of tin or mercury respectively. Accordingly, the superconductive material used to make the inductance has a higher critical magnetic field relative to that of the core.

As will now be apparent, the present invention may be used to provide remote electrical tuning for resonant circuits. The present invention also finds use as a nonlinear reactance element in a parametric amplifier. It is well known in the parametric amplifier art that an inductance or capacitance element, whose reactance is a function of the applied current or voltage, is necessary. The present invention comprises such a nonlinear reactance which depends on the magnitude of the applied current in the control coil at the pump frequency. In order that the present invention be useful at ultra-high frequencies, an ideal superconductor should be chosen for the core since such materials are known to have negligibly small resistance at frequencies below approximately 1,000 megacycles. Thus, a parametric amplifier employing the present invention may be used at frequencies of the order of several hundred megacycles for the pump frequency.

The various features and advantages of the invention are thought to be clear from the foregoing description. Various other features and advantages not specifically enumerated will undoubtedly occur to those versed in the art, as likewise will many variations and modifications of the embodiments illustrated, all of which may be achieved without departing from the spirit and scope of the invention as defined by the following claims.

What is claimed is:

1. In a superconductor device the combination comprising:

(a) an elongated core of superconductive material;

(b) an inductance comprising a plurality of turns of a superconductive conductor wound around said core whereby the number of magnetic lines of flux linkage in said inductance is substantially reduced by the presence of said core;

(c) a variable capacitor of superconductive material coupled to said inductance to form a superconductive resonant circuit, said core, inductance and capacitor being maintained at a superconductive temperature;

(d) means coupling said core and said capacitor for simultaneously varying the capacitance of said capacitor and the position of said core in said inductance; and (e) means for supplying to said resonant circuit an alternating current having a magnitude insufficient to transfer said core to the normal state.

2. In a superconductor resonant circuit coupled to a receiving antenna system the combination comprising:

(a) an elongated core of superconductive material;

(b) an inductance comprising a plurality of turns of a superconductive conductor wound around said core whereby the number of magnetic lines of flux linkage in said inductance is substantially reduced by the presence of said core;

(c) a variable capacitor of superconductive material coupled to said inductance to form a superconductive resonant circuit, said core, inductance and capacitor being maintained at a superconductive temperature;

(d) means coupling said core and said capacitor for simultaneously varying the position of said core in said inductance as the capacitance of said capacitor is varied;

(e) means for supplying to said resonant circuit an alternating current having a magnitude insufficient to transfer said core and said resonant circuit to the normal state; and (f) a superconductive shield surrounding said inductance.

3. In a superconductor device the combination comprising:

(a) an elongated core of superconductive material;

(b) an inductance comprising a plurality of turns of a superconductive conductor wound around said core, the number of magnetic lines of flux linkage in said inductance being at a minimum when all of said core is in the superconductive state;

(c) a variable capacitor of superconductive material coupled to said inductance to form a superconductive resonant circuit, said core, inductance and capacitor being maintained at a superconductive temperature;

(d) means for applying to said core a magnetic field that varies linearly along the longitudinal axis of said core including a coil surrounding said core and having a variable field gradient, a source of direct current, and a variable resistor; and (e) means coupling said capacitor and said variable resistor for simultaneously varying the magnitude of the current flowing in said coil and the capacitance of said capacitor.

4. In a superconductor device the combination comprising:

(a) an elongated core of superconductive material;

(b) an inductance comprising a plurality of turns of a superconductive conductor wound around said core, the number of magnetic lines of flux linkage in said inductance being at a minimum when all of said core is in the superconductive state;

(c) a variable capacitor of superconductive material coupled to said inductance to form a superconductive resonant circuit, said core, inductance and capacitor being maintained at a superconductive temperature;

(d) means for applying to said core a magnetic field that varies linearly along the longitudinal axis of said core including a coil surrounding said core and having a variable pitch to cause different intensities of magnetic field to be applied to different portions of said core, a source of direct current, and a variable resistor; and (e) means coupling said capacitor and said variable resistor for simultaneously varying the magnitude of the current flowing in said coil and the capacitance of said capacitor, said superconductive conductor having a higher critical field relative to said superconductive core at said superconductive temperature.

5. In a superconductor resonant circuit coupled to a receiving antenna system the combination comprising:

(a) an elongated and laminated core of superconductive material;

(b) an inductance comprising a plurality of turns of a superconductive conductor wound around said core, the number of magnetic lines of flux linkage in said inductance being at a minimum when all of said core is in the superconductive state;

(c) a variable capacitor of superconductive material coupled to said inductance to form a superconductive resonant circuit, said core, inductance and capacitor being maintained at a superconductive temperature;

(d) means for applying to said core a magnetic field that varies linearly along the longitudinal axis of said core including a coil surrounding said core and having a variable pitch to cause linearly varying intensities of magnetic field to be applied to different portions of said core, a source of direct current, and a variable resistor;

(e) means coupling said capacitor and said variable resistor for simultaneously varying the magnitude of the current flowing in said coil and the capacitance of said capacitor, said superconductive conductor having a higher critical field relative to said superconductive core at said superconductive temperature; and (f) a superconductive shield surrounding said inductance and said coil.

References Cited

UNITED STATES PATENTS

| | | | |
|---|---|---|---|
| 2,313,032 | 3/1943 | Scheer | 334—70 X |
| 2,320,483 | 6/1943 | Stocker | 334—70 |
| 2,704,431 | 3/1955 | Steele | 331—70 X |

HERMAN KARL SAALBACH, *Primary Examiner.*

P. L. GENSLER, *Assistant Examiner.*